(12) United States Patent
Sardesai et al.

(10) Patent No.: US 8,420,542 B2
(45) Date of Patent: Apr. 16, 2013

(54) METHOD OF PATTERNED IMAGE REVERSAL

(75) Inventors: Viraj Yashawant Sardesai, Hopewell Junction, NY (US); Michael P. Belyansky, Hopewell Junction, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 13/117,208

(22) Filed: May 27, 2011

(65) Prior Publication Data

US 2012/0302069 A1 Nov. 29, 2012

(51) Int. Cl.
*H01L 21/311* (2006.01)

(52) U.S. Cl.
USPC ........... 438/703; 438/736; 438/761; 438/950; 257/E21.249

(58) Field of Classification Search .................. 438/736, 438/761, 950, 703; 257/E21.249
See application file for complete search history.

(56) References Cited

U.S. PATENT DOCUMENTS

| | | | |
|---|---|---|---|
| 5,328,810 A * | 7/1994 | Lowrey et al. | 430/313 |
| 5,340,438 A | 8/1994 | Roselle | |
| 7,332,262 B2 | 2/2008 | Latchford et al. | |
| 7,455,956 B2 | 11/2008 | Sandhu et al. | |
| 7,678,704 B2 | 3/2010 | Klee et al. | |
| 7,776,747 B2 | 8/2010 | Ban et al. | |
| 2001/0013603 A1* | 8/2001 | Mitsutake et al. | 257/10 |
| 2003/0127426 A1* | 7/2003 | Chang et al. | 216/41 |
| 2005/0214694 A1 | 9/2005 | Hong et al. | |
| 2006/0267075 A1* | 11/2006 | Sandhu et al. | 257/316 |
| 2008/0254607 A1* | 10/2008 | Plat et al. | 438/594 |
| 2008/0272467 A1* | 11/2008 | Bok et al. | 257/629 |
| 2009/0057821 A1* | 3/2009 | Issaq et al. | 257/530 |
| 2009/0104786 A1* | 4/2009 | Narita | 438/763 |
| 2010/0099261 A1 | 4/2010 | Lee | |
| 2010/0190325 A1* | 7/2010 | Kim | 438/585 |
| 2010/0248160 A1 | 9/2010 | Lee | |

* cited by examiner

*Primary Examiner* — Angel Roman
(74) *Attorney, Agent, or Firm* — Yuanmin Cai; Howard Cohn

(57) ABSTRACT

A method of forming a reverse image pattern on a semiconductor base layer is disclosed. The method comprises depositing a transfer layer of amorphous carbon on the semiconductor base layer, depositing a resist layer on the transfer layer, creating a first pattern in the resist layer, creating the first pattern in the transfer layer, removing the resist layer, depositing a reverse mask layer, planarizing the reverse mask layer, and removing the transfer layer, thus forming a second pattern that is a reverse image of the first pattern.

16 Claims, 4 Drawing Sheets

METHOD OF PATTERNED IMAGE REVERSAL

FIELD OF THE INVENTION

The present invention generally relates to a method for forming a pattern during fabrication of a semiconductor device, and, more specifically, to a method for forming an image-reversed pattern.

BACKGROUND OF THE INVENTION

In general, the lithography process used during semiconductor fabrication comprises the following steps: A layer of photoresist (PR) material is first applied on the surface of the wafer. The resist layer is then selectively exposed to radiation, such as ultraviolet light, electrons, or X-rays, with the exposed areas defined by a mask.

After exposure, the PR layer is subjected to development which alters the chemical property of the PR being exposed in the unwanted areas of the PR layer, exposing the corresponding areas of the underlying layer. Depending on the resist type, the development stage may destroy either the exposed or unexposed areas of the PR layer. The areas with no resist material left on top of them are then being processed to form patterns through additive and/or subtractive processes, allowing the selective deposition or removal of material on the substrate (or other base layer).

During development, the unwanted areas in the PR are dissolved by the developer. In the case where the exposed areas become soluble in the developer, a positive image of the mask pattern is produced on the resist. Such a resist is therefore called a positive photoresist. Negative photoresist layers result in negative images of the mask pattern, wherein the unexposed areas are soluble in the developer and those exposed areas are made non-soluble or significantly less soluble in the developer. Wafer fabrication may employ both positive and negative photoresists, although positive resists are preferred because they offer higher resolution capabilities. Since wafer fabrication may employ both positive and negative photoresists, it is therefore desirable, in certain circumstances, to have a cost-effective way to make a reverse-image of a mask.

SUMMARY

In one embodiment of the present invention, a method of forming a reverse image pattern on a semiconductor substrate is provided. The method comprises depositing a transfer layer of amorphous carbon on the semiconductor substrate, depositing a resist layer on the transfer layer, creating a first pattern in the resist layer, creating the first pattern in the transfer layer, removing the resist layer, depositing a reverse mask layer over the first pattern in the transfer layer, planarizing the reverse mask layer down to the transfer layer whereby the first pattern remains filled with the reverse mask layer, and removing the transfer layer, thereby forming a second pattern in the reverse mask layer that is a reverse image of the first pattern.

In another embodiment of the present invention, a method of forming a reverse image pattern on a semiconductor substrate is provided, the method comprises depositing a transfer layer of amorphous carbon on the semiconductor substrate, depositing a resist layer on the transfer layer, creating a first pattern in the resist layer, creating the first pattern in the transfer layer, removing the resist layer, depositing a metal reverse mask layer over the first pattern in the transfer layer, planarizing the metal reverse mask layer; and removing the transfer layer without removing a portion of the metal reverse mask layer, thereby forming a second pattern that is a reverse image of the first pattern.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows a semiconductor structure at a starting point for fabrication of a reverse image pattern.

FIG. 2 shows a semiconductor structure at a subsequent point in the fabrication of a reverse image pattern where the transfer layer is etched.

FIG. 3 shows a semiconductor structure at a subsequent point in the fabrication of a reverse image pattern where the first mask layer is removed.

FIG. 4 shows a semiconductor structure at a subsequent point in the fabrication of a reverse image pattern where a second mask layer is deposited.

FIG. 5 shows a semiconductor structure at a subsequent point in the fabrication of a reverse image pattern after a planarization step.

FIG. 6 shows a semiconductor structure after completion of the fabrication of a reverse image pattern.

FIG. 7 is a flowchart indicating process steps for fabricating a reverse image pattern.

DETAILED DESCRIPTION

Figure 1:
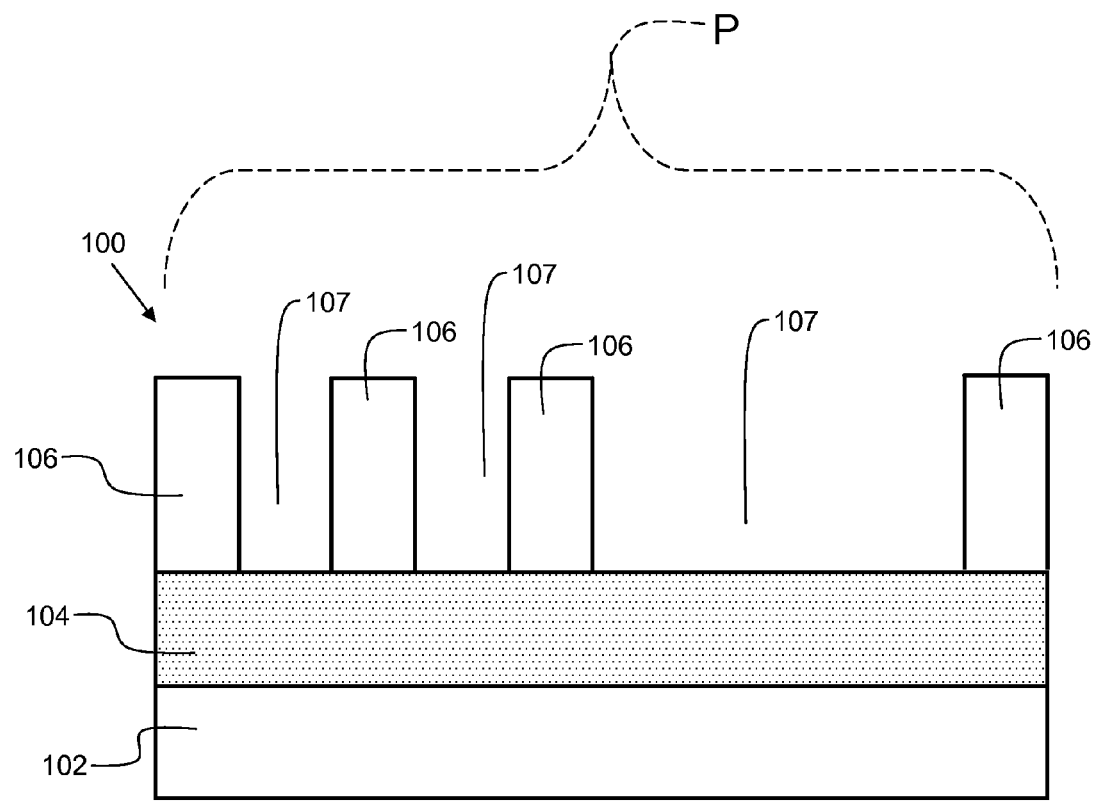

FIG. 1 shows a semiconductor structure 100 at a starting point for fabrication of a reverse image pattern. Semiconductor structure 100 comprises a base layer 102 whereupon a reverse image pattern is to be formed. Base layer 102 may be a substrate, which may be comprised of silicon. However, substrate 102 is not limited to silicon and may be comprised of other substances, including, but not limited to, silicon oxide, silicon nitride, or sapphire (aluminum oxide—Al2O3). Substrate 102 may alternatively be comprised of a III-V or II-VI compound such as GaAs, InP, GaAlAs, ZnSe, ZnTe, to name a few. In one embodiment, a carbon-containing layer 104, such as an amorphous carbon layer, is deposited on substrate 102. This carbon-containing layer 104 may be used as a pattern transfer layer and be referred to hereinafter as a transfer layer 104. The transfer layer 104 has a thickness in the range of 100 angstroms to 5000 angstroms. The transfer layer 104 may be deposited via chemical vapor deposition (CVD), or plasma enhanced chemical vapor deposition (PECVD). A resist layer 106 is deposited on top of the transfer layer 104, and subsequently patterned through a lithographic process. In one embodiment, the resist layer 106 has a thickness in the range of about 0.3 microns to about 1.5 microns. The resist layer 106 is exposed and image developed to create a pattern P in the resist layer 106 by standard lithographic patterning. This exposes a portion of the underlying transfer layer 104 at various points. Hence, pattern P comprises a pattern of resist layer regions 106 and openings 107. As will be described with the upcoming figures, a reverse image pattern P' is formed using the process described herein.

Figure 2:
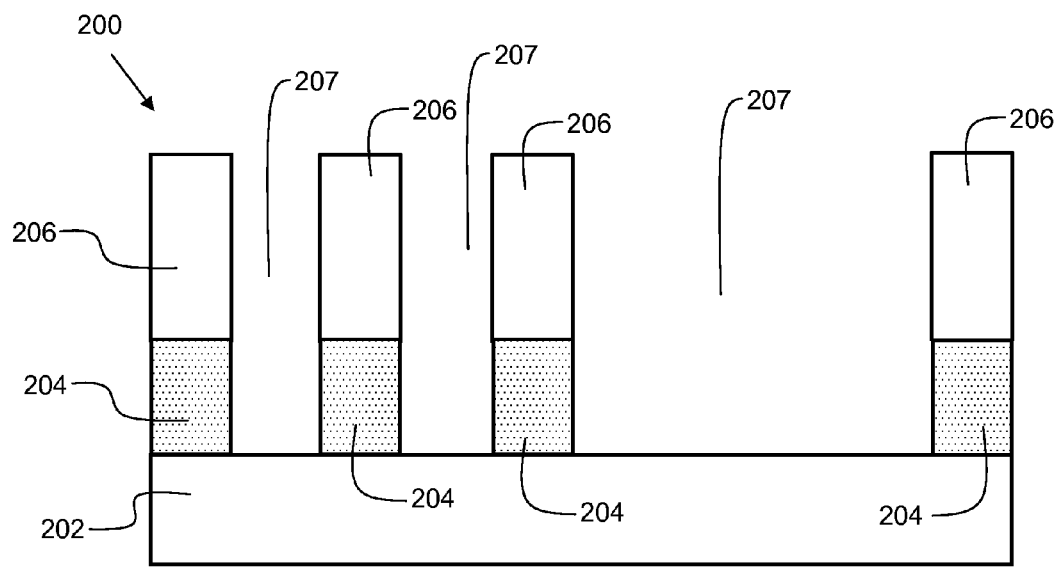

FIG. 2 shows a semiconductor structure 200 at a subsequent step in the fabrication of a reverse image pattern where the transfer layer 204 is etched to expose an underlying portion of substrate 202 below the openings 207. In one embodiment, this is performed via a reactive ion etch process. The reactive ion etch process should be selective to substrate 202.

As stated in the brief description of the drawings, often, similar elements may be referred to by similar numbers in various figures (FIGs) of the drawing, in which case typically the last two significant digits may be the same, the most significant digit being the number of the drawing figure (FIG). For example, base layer 202 of FIG. 2 is similar to base layer 102 of FIG. 1, and transfer layer 204 of FIG. 2 is similar to transfer layer 104 of FIG. 1.

Figure 3:
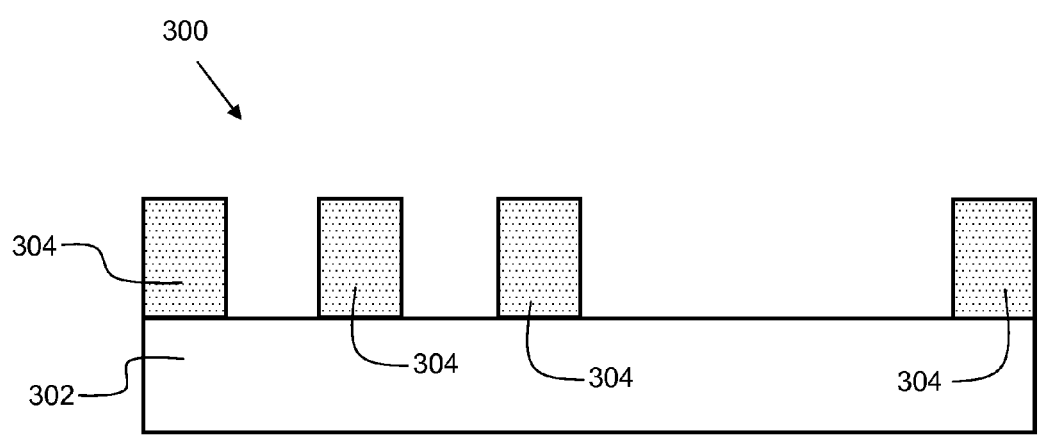

FIG. 3 shows a semiconductor structure 300 at a subsequent step in the fabrication of a reverse image pattern where the resist layer is removed (compare with 206 of FIG. 2) following the step shown in FIG. 2. In one embodiment, the resist layer is removed via a wet etch process using a substance such as sulfuric acid. The etch is selective, and does not significantly impact the regions of transfer layer 304.

Figure 4:
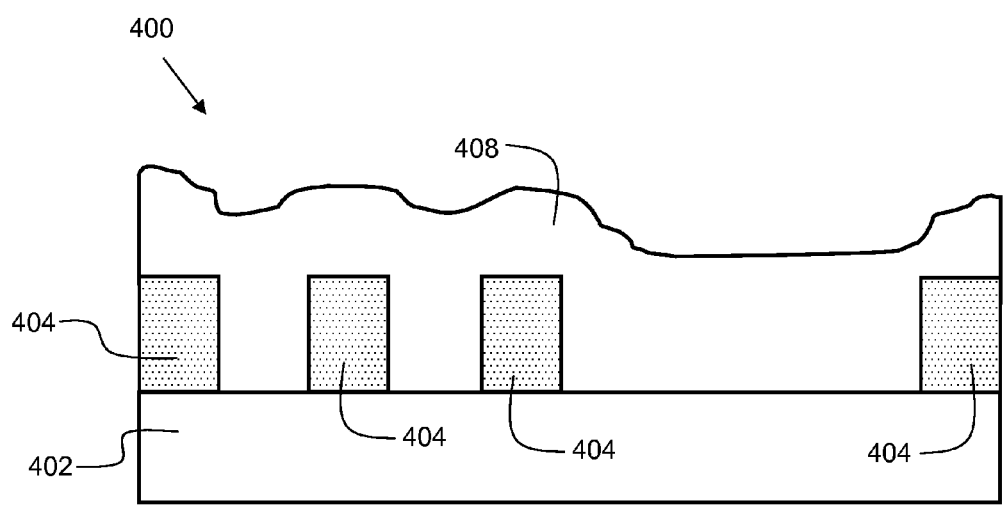

FIG. 4 shows a semiconductor structure 400 at a subsequent step (following from the structure 300 shown in FIG. 3) in the fabrication of a reverse image pattern where a reverse mask layer 408 is deposited. In one embodiment, reverse mask layer 408 is an insulator, such as a low temperature oxide (LTO). In another embodiment, the reverse mask layer 408 is a metal, such as tungsten, copper, or aluminum, for example.

The material used for the reverse mask layer 408 should meet the following criteria:
  it should be able to fill a cavity with minimal formation of voids;
  the chemical mechanical polish of the reverse mask layer should be selective to amorphous carbon;
  the reverse mask layer 408 should be able to withstand oxygen ash used in an amorphous carbon removal step. Insulators, noble metals, as well as metals with conductive oxides, such as ruthenium, can be used for this layer. Furthermore, the choice material used for layer 408 also depends on the application. If insulating lines (pattern) is needed than oxide is the appropriate choice. However, for applications warranting a conducting pattern, then the layer should be metallic (conductive) in nature.

The reverse mask layer 408 may be deposited via chemical vapor deposition, atomic layer deposition, plasma enhanced chemical vapor deposition, or other suitable technique. It is preferable to use a deposition technique that does not leave voids in smaller areas of the pattern, and also to limit overburden (the amount of excess material) that can cause problems during planarization.

Figure 5:
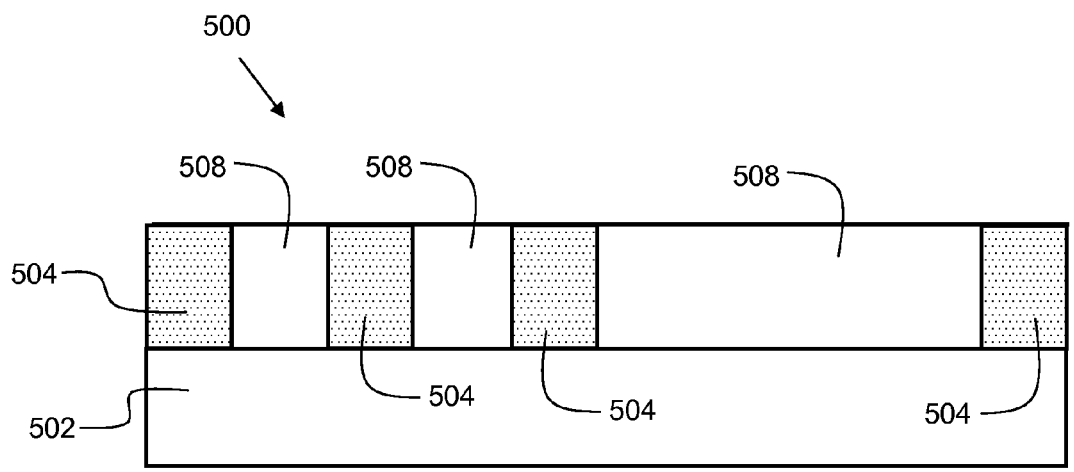

FIG. 5 shows a semiconductor structure 500 at a subsequent point in the fabrication of a reverse image pattern after a planarization step where the reverse mask layer down to the transfer layer 504. In one embodiment, a chemical mechanical polish (CMP) process is used to planarize structure 500. Transfer layer 504 serves as an etch stopping layer for the CMP process, since the transfer layer 504 of amorphous carbon has a sufficiently high resistance to removal, in particular when it is compared with the removal of material of the reverse mask layer, from etching and polishing techniques. The unique combination of material improves and eases the process.

Figure 6:
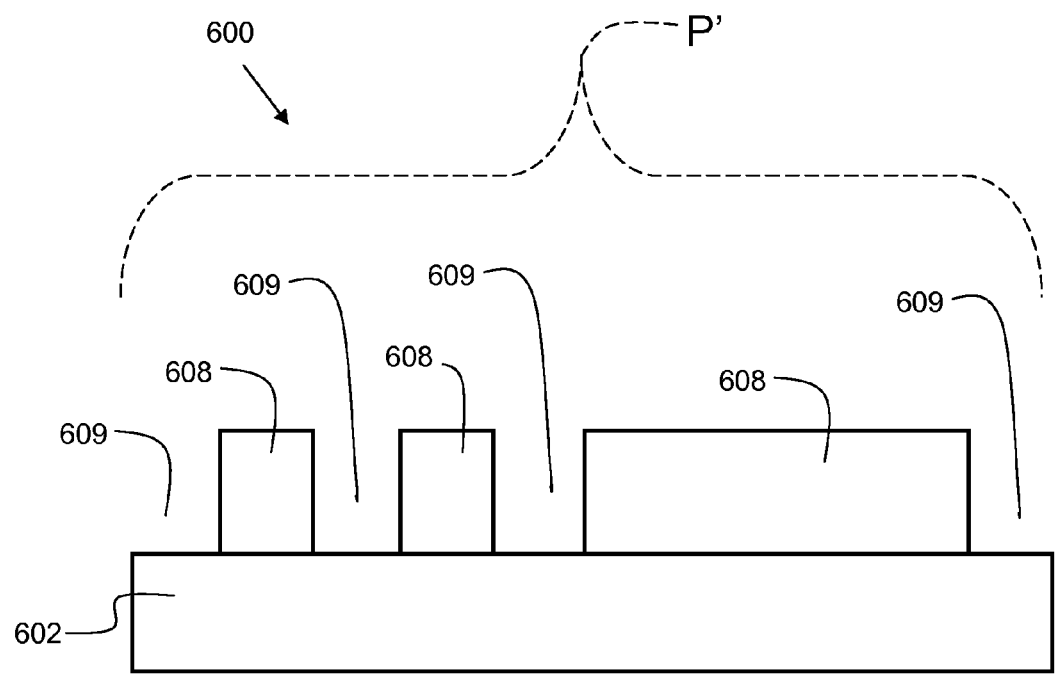

FIG. 6 shows a semiconductor structure 600 after completion of the fabrication of a reverse image pattern. The transfer layer (see 504 of FIG. 5) is removed, leaving regions of the reverse mask layer 608, with openings 609 spaced between regions of the reverse mask layer 608. This forms pattern P', which comprises a pattern of regions of reverse mask layer 608 and openings 609. Pattern P' is a reverse image of pattern P (see FIG. 1) in that openings 609 occupy the space where regions of transfer layer 204 (FIG. 2) were previously. Similarly, regions of reverse mask layer 608 occupy space where openings 207 (see FIG. 2) were previously.

The removal of the transfer layer (see 504 of FIG. 5) may be accomplished with plasma ashing. A plasma, such as oxygen plasma, or ozone plasma may be used to remove the transfer layer without harming the reverse mask layer 608. The operating temperature used during the plasma ashing process may be in the range of 100 to 400 degrees Celsius.

Figure 7:
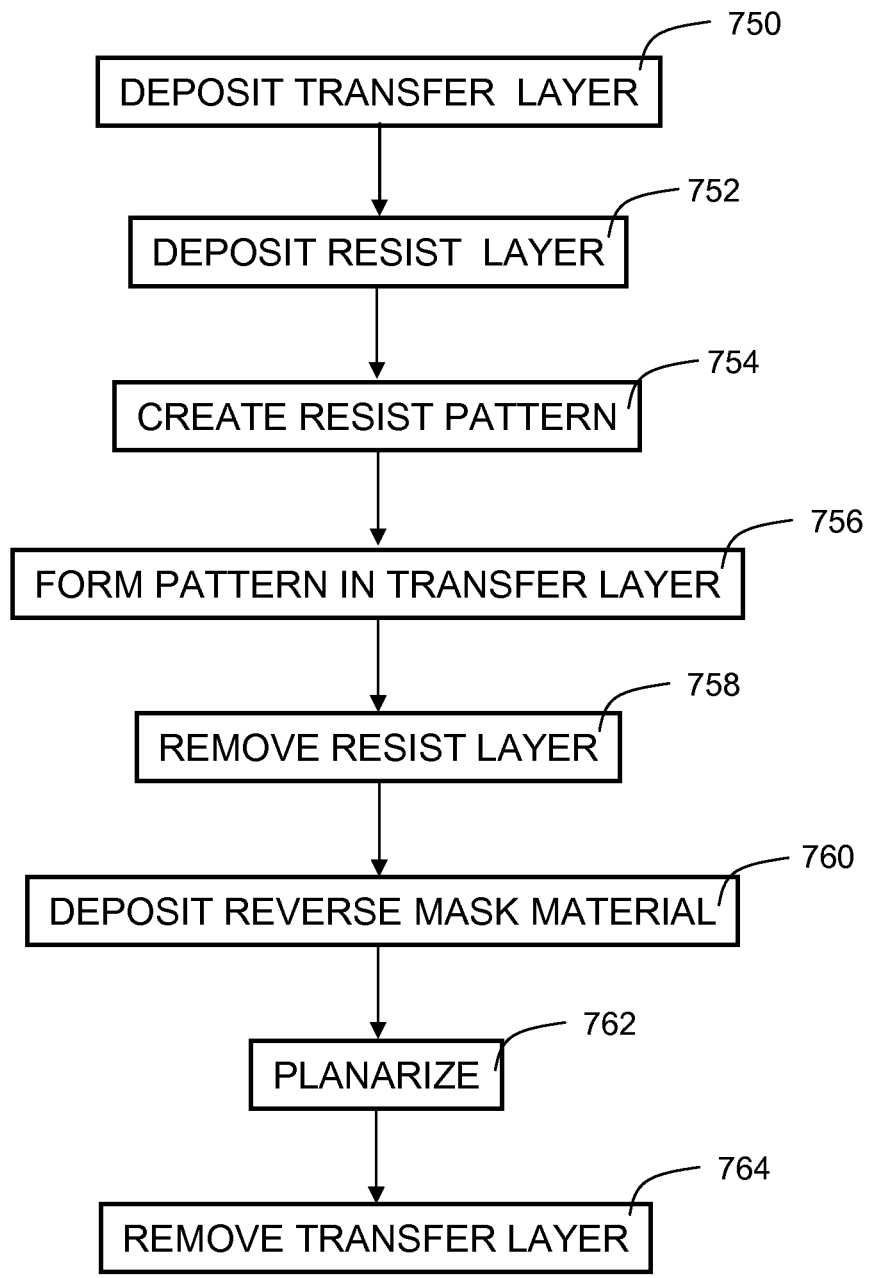

FIG. 7 is a flowchart indicating process steps for fabricating a reverse image pattern. In process step 750, a transfer layer of amorphous carbon is deposited (see 104 of FIG. 1). In process step 752, a resist layer is deposited (see 106 of FIG. 1). In process step 754, a pattern is created in the resist layer (see P of FIG. 1). In process step 756, a pattern is formed in the transfer layer of amorphous carbon (see 204 of FIG. 2). In process step 758, the resist layer is removed (see FIG. 3). In process step 760, a reverse mask layer is deposited (see 404 of FIG. 4). In process step 762, the substrate is planarized (see FIG. 5). In process step 764, the transfer layer of amorphous carbon is removed, thereby forming a reverse image pattern (see P' of FIG. 6).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices and circuits) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a reverse image pattern on a semiconductor base layer, comprising:
  depositing a transfer layer of amorphous carbon on the semiconductor base layer;
  depositing a resist layer on the transfer layer;
  creating a first pattern in the resist layer;
  transferring the first pattern from the resist layer into the transfer layer;
  removing the resist layer of the first pattern;
  depositing a reverse mask layer comprised of a single material over the first pattern in the transfer layer;
  planarizing the reverse mask layer down to the transfer layer whereby the first pattern remains filled with the reverse mask layer; and removing the transfer layer, thereby forming a second pattern in the reverse mask layer that is a reverse image of the first pattern.

2. The method of claim 1, wherein depositing a transfer layer of amorphous carbon is performed via chemical vapor deposition.

3. The method of claim 1, wherein depositing a reverse mask layer over the first pattern in the transfer layer comprises depositing a layer of ruthenium.

4. The method of claim 1, wherein depositing a reverse mask layer over the first pattern in the transfer layer comprises depositing a layer of a noble metal.

5. The method of claim 1, wherein depositing a transfer layer of amorphous carbon on the semiconductor base layer comprises depositing a transfer layer on a substrate comprised of silicon.

6. The method of claim 1, wherein depositing a transfer layer of amorphous carbon on the semiconductor base layer comprises depositing a transfer layer on a substrate comprised of a material selected from the group consisting of aluminum oxide, silicon oxide and silicon nitride.

7. The method of claim 1, wherein creating the first pattern in the transfer layer comprises performing a reactive ion etch in the transfer layer.

8. The method of claim 7, wherein performing a reactive ion etch in the transfer layer comprises etching the transfer layer until an underlying portion of the semiconductor base layer is exposed.

9. The method of claim 1, wherein depositing a reverse mask layer is performed with chemical vapor deposition.

10. The method of claim 1, wherein depositing a reverse mask layer is performed with atomic layer deposition.

11. The method of claim 1, wherein depositing a reverse mask layer comprises depositing a layer of low-temperature oxide.

12. A method of forming a reverse image pattern on a semiconductor base layer, comprising:
    depositing a transfer layer of amorphous carbon on the semiconductor base layer;
    depositing a resist layer on the transfer layer;
    creating a first pattern in the resist layer;
    creating the first pattern in the transfer layer;
    removing the resist layer;
    depositing a metal reverse mask layer comprised of a single material over the first pattern in the transfer layer;
    planarizing the metal reverse mask layer; and
    removing the transfer layer without removing a portion of the metal reverse mask layer, thereby forming a second pattern that is a reverse image of the first pattern.

13. The method of claim 12, wherein depositing a metal reverse mask layer comprises depositing a layer of tungsten.

14. The method of claim 12, wherein depositing a metal reverse mask layer comprises depositing a layer of copper.

15. The method of claim 12, wherein planarizing the reverse mask layer is performed with a chemical mechanical polish process.

16. The method of claim 15, further comprising using the transfer layer of amorphous carbon as an etch stopping layer.

* * * * *